US009513184B2

(12) United States Patent
Goossens et al.

(10) Patent No.: US 9,513,184 B2
(45) Date of Patent: Dec. 6, 2016

(54) MEMS DEVICE CALIBRATION

(71) Applicant: ams International AG, Rapperswil-Jona (CH)

(72) Inventors: Martijn Goossens, Veldhoven (NL); Willem Frederik Adrianus Besling, Eindhoven (NL); Peter Gerard Steeneken, Valkenswaard (NL); Casper van der Avoort, Waalre (NL); Remco Henricus Wilhelmus Pijnenburg, Hoogeloon (NL)

(73) Assignee: AMS INTERNATIONAL AG, Rapperswil-Jona (CH)

( * ) Notice: Subject to any disclaimer, the term of this patent is extended or adjusted under 35 U.S.C. 154(b) by 121 days.

(21) Appl. No.: 14/301,618

(22) Filed: Jun. 11, 2014

(65) Prior Publication Data
US 2015/0362395 A1    Dec. 17, 2015

(51) Int. Cl.
*G01L 27/00* (2006.01)
*B81C 99/00* (2010.01)

(52) U.S. Cl.
CPC ......... *G01L 27/005* (2013.01); *B81C 99/0035* (2013.01); *G01L 27/002* (2013.01); *B81B 2201/02* (2013.01); *B81B 2201/0264* (2013.01); *B81B 2207/11* (2013.01)

(58) Field of Classification Search
CPC .......... B81C 99/0035; B81C 2201/02; B81C 2207/11; B81C 2201/0264; B81C 99/003; B81C 99/0045; B81C 99/005; G01L 27/002; G01L 27/005; G01P 21/00; G01R 35/00
USPC ......................................................... 73/1.11
See application file for complete search history.

(56) References Cited

U.S. PATENT DOCUMENTS

| 6,978,673 | B2 * | 12/2005 | Johnson | G01R 33/0286 438/50 |
| 8,157,178 | B2 * | 4/2012 | Dewan | G06K 19/07345 235/492 |
| 9,285,289 | B2 * | 3/2016 | Dawson | G01L 27/002 |
| 2005/0028582 | A1 | 2/2005 | Schatz et al. | |
| 2006/0208326 | A1 * | 9/2006 | Nasiri | B81C 1/00238 257/414 |
| 2007/0082422 | A1 * | 4/2007 | Silverbrook | B41J 2/1404 438/52 |
| 2008/0032457 | A1 * | 2/2008 | McWilliams | B81C 1/00293 438/125 |
| 2008/0302659 | A1 * | 12/2008 | Sheppard, Jr. | A61B 5/14532 204/403.01 |

(Continued)

FOREIGN PATENT DOCUMENTS

EP       2711677        3/2014
WO  WO-2013003789 A1   1/2013

OTHER PUBLICATIONS

Weisstein, Eric W. "Thiele's Interpolation Formula." From MathWorld—A Wolfram Web Resource; Retrieved from the internet Jun. 1, 2014 http://mathworld.wolfram.com/ThielesInterpolationFormula.html.

*Primary Examiner* — David A Rogers
(74) *Attorney, Agent, or Firm* — McDermott Will & Emery LLP

(57) ABSTRACT

One example discloses a MEMS device, including: a cavity having an internal environment; a seal isolating the internal environment from an external environment outside the MEMS device; wherein the seal is susceptible to damage in response to a calibration unsealing energy; wherein upon damage to the seal, a pathway forms which couples the internal environment to the external environment; and a calibration circuit capable of measuring the internal environment before and after damage to the seal.

23 Claims, 8 Drawing Sheets

(56) References Cited

U.S. PATENT DOCUMENTS

| | | | |
|---|---|---|---|
| 2010/0013501 A1* | 1/2010 | Van Den Boom | G01D 3/08 324/679 |
| 2010/0050747 A1 | 3/2010 | Hua et al. | |
| 2010/0190301 A1* | 7/2010 | Delapierre | B81C 1/00293 438/124 |
| 2012/0007598 A1* | 1/2012 | Lo | G01R 33/0011 324/252 |
| 2012/0167659 A1 | 7/2012 | Besling et al. | |
| 2013/0001550 A1* | 1/2013 | Seeger | G01L 5/223 257/48 |
| 2013/0036827 A1 | 2/2013 | Besling et al. | |
| 2013/0118265 A1 | 5/2013 | Besling et al. | |
| 2013/0122332 A1 | 5/2013 | van Lammeren et al. | |
| 2013/0233086 A1 | 9/2013 | Besling et al. | |
| 2013/0277776 A1* | 10/2013 | Herzum | B81C 99/0045 257/416 |
| 2013/0316830 A1 | 11/2013 | Sedzin et al. | |
| 2013/0328142 A1 | 12/2013 | Nackaerts et al. | |
| 2014/0053651 A1 | 2/2014 | Besling et al. | |
| 2014/0070337 A1 | 3/2014 | Besling et al. | |
| 2015/0160089 A1 | 6/2015 | Dawson et al. | |

* cited by examiner

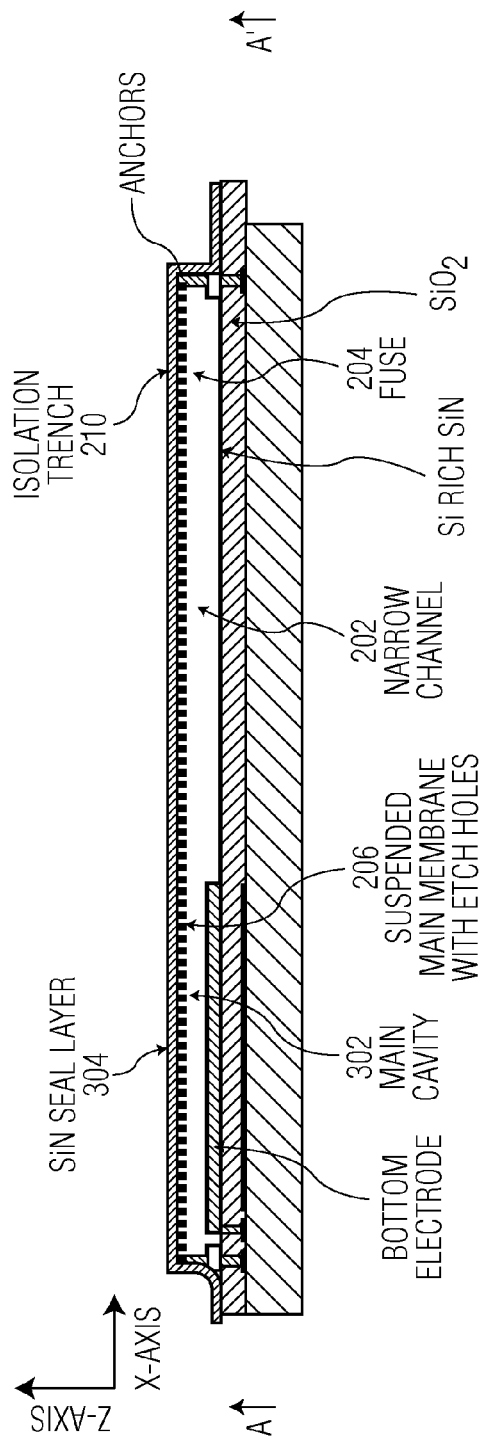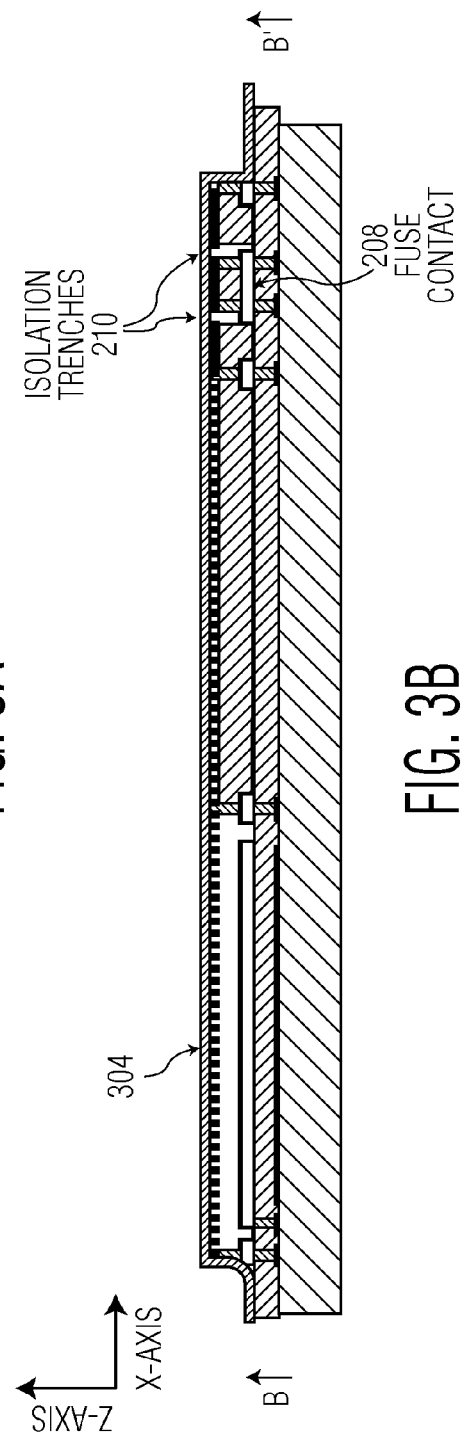
FIG. 3A
FIG. 3B

MEMS DEVICE CALIBRATION

BACKGROUND

Brief Background Introduction

This specification relates generally to MEMS devices and in one example to calibrating a MEMS device.

SUMMARY

A MEMS device, comprising: a cavity having an internal environment; a seal isolating the internal environment from an external environment outside the MEMS device; wherein the seal is susceptible to damage in response to a calibration unsealing energy; wherein upon damage to the seal, a pathway forms which couples the internal environment to the external environment; and a calibration circuit capable of measuring the internal environment before and after damage to the seal.

A method calibrating a MEMS device, comprising: damaging a seal isolating an internal environment within the MEMS device from an external environment outside the MEMS device with a calibration unsealing energy; wherein upon damage to the seal, a pathway forms which couples the internal environment to the external environment; measuring a parameter of the internal environment before and after damage to the seal; and calibrating the MEMS device based on the measuring.

The above summary is not intended to represent every example embodiment within the scope of the current or future Claim sets. Additional example embodiments are discussed within the Figures and Detailed Description below.

BRIEF DESCRIPTION OF THE DRAWINGS

FIGS. 3A and 3B are cross-sectional views of the FIG. 2 MEMS device.

Figure 1:
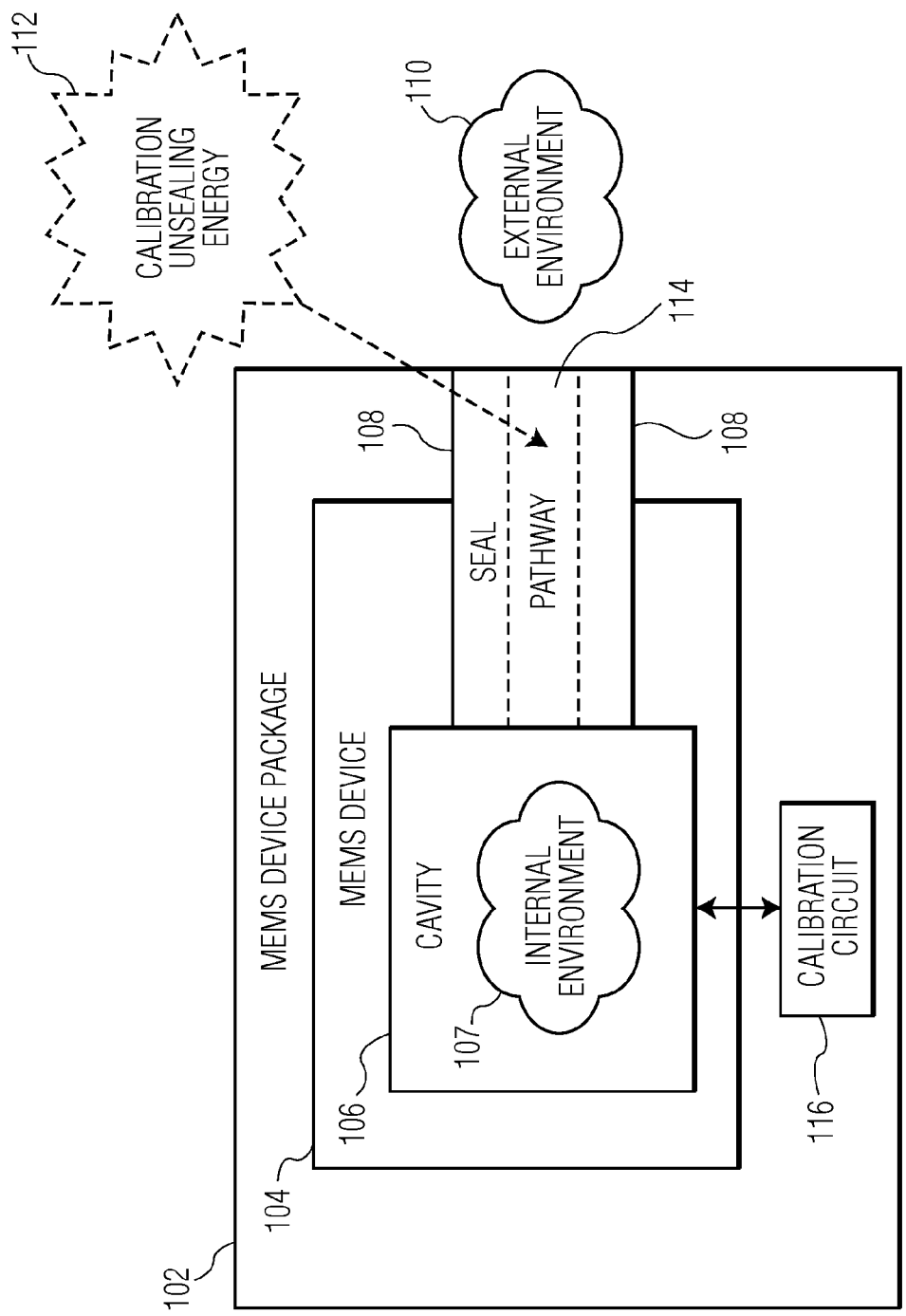
FIG. 1 is one example of a MEMS device.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

MEMS devices, such as capacitive pressure sensors and other sensors or actuators, are useful in consumer and industrial focused applications including: mobile phones (e.g. altimeters, barometers, etc.); clothing (e.g. shoe sensors); medical devices (e.g. intraocular pressure monitoring, and detecting sleep apnea); automotive (e.g. tire pressure monitoring, seat occupancy detection, crash detection in bumpers/doors) and pressostat level sensing (e.g. washing machines, air conditioners and filter replacement). In some applications, MEMS devices are also calibrated before use.

MEMS devices often measure the difference between the external pressure and a reference pressure inside of a sealed cavity. The pressure inside of the sealed cavity can vary as a result of process circumstances. A calibration procedure is needed to correct the pressure reading for unknown variations in the pressure in the sealed cavity.

For the calibration procedure a calibration device is needed. Ideally the only difference between the calibration device and the actual pressure sensor should be that the calibration device has a non-hermetic sealed cavity whereas the actual pressure sensor has a hermetically sealed cavity.

The pressure in the sealed cavity of the actual pressure sensor is determined during a calibration procedure that compares the properties of the calibration device and the actual pressure sensor.

Alternatively the pressure in the sealed cavity of the actual pressure sensor can also be determined during a calibration procedure that compares the properties of the calibration device before and after breaking the hermetic seal of the calibration device.

Ideally the calibration device is placed on the same die, in the same package as the actual MEMS pressure sensor.

MEMS devices whose calibration requires a comparison between measurement of a calibration device's hermetically sealed cavity and a cavity after breaching and exposure to an external environment may require particular handling. One approach to breaching a hermetically sealed cavity requires etching a small hole in a cavity membrane during one of the last wafer processing steps.

This may affect the performance of the MEMS calibration device because of one or more of the following reasons. Water and other unwanted substances can enter through that hole during the processing steps that occur between the time of etching and the time of the calibration measurement, such as wafer dicing, packaging and assembly; matching between a sealed and open structure is deteriorated; and the actual sensor characteristics can change due to temperature and mechanical stress during subsequent steps during assembly: wafer dicing, wafer grinding, die placement, wire bonding, molding and reflow soldering. Matching can become an issue if a calibration device is used that is not adjacent to the device which needs to be calibrated.

Presented below is a MEMS calibration device whose hermetic seal is broken during the calibration procedure, after the device is packaged. Calibration in one example embodiment can be performed by measuring a cavity resonance frequency before and after the seal is breached at a well known pressure. A difference in resonance frequency at atmospheric pressure between the sealed state and the unsealed state of the MEMS device structure is a good measure of the cavity pressure.

The seal can be breached in a number of ways, such as by heating a fuse proximate to the seal with a large enough current. Other ways of breaching (i.e. damaging) the seal are presented below.

Calibration of the MEMS device after packaging reduces pollution of the MEMS calibration device with water, dirt or other debris since such materials cannot enter a cavity within the MEMS calibration device during wafer processing because the cavity remains sealed during processing and packaging.

As applied to a MEMS pressure sensor device, this allows for an accurate determination of a sensor cavity pressure for each fabricated device. The matching can be near to perfect because the calibration procedure can consist of measuring the same MEMS device before breaking the vacuum seal and afterwards. Provided that the act of breaking the hermetic seal has no influence on the sensor's parameters of interest (e.g. resonance frequency, capacitance, etc.), the open and sealed MEMS sensor device have near perfect matching because physically it's the same device. Such a MEMS device also allows for accurate monitoring of potential outgassing inside a sealed cavity of a matched companion pressure sensor.

Addition details of the present calibration device are now discussed.

FIG. 1 is one example embodiment of a MEMS device 104. The MEMS device 104 includes: a cavity 106 having an internal environment 107, and a seal 108 isolating the internal environment 107 from an external environment 110 outside the MEMS device 104. The seal 108 is susceptible to damage in response to a calibration unsealing energy 112. Upon damage to the seal, a pathway 114 forms which couples the internal environment 107 to the external environment 110. A calibration circuit 116 is capable of measuring the internal environment 107 before and after damage to the seal. The before and after measurements are then used to calibrate the MEMS device 104.

The MEMS device 104 is embedded in a package 102, and the seal 108 is susceptible to damage in response to the calibration unsealing energy 112 while within the package 102. The unsealing energy 112 includes either a heat source and/or a puncturing device. The heat source can be either an electrical current, a laser or some other form of energy capable of damaging the seal 108. Damage to the seal 108 such that the internal environment 107 is coupled to the external environment 110 can be in one or more forms, including: rupturing, breaching breaking, fracturing, and melting.

If the seal 108 is damaged by laser energy, a small dedicated area, with some optical alignment marks, can be added to the MEMS device 104. This area should be optically accessible after packaging.

Mechanical damage to the seal 108 can be effected with a probe needle at a dedicated puncturing area on the MEMS device 104.

In one example, the seal 108 is a fusible link, and the fusible link can damage the seal 108 in response to an electrical current. In another example, the seal 108 includes a thermal isolation region which reduces a power of the unsealing energy 112 required to damage the seal. The seal's 108 power dissipation per unit area may be adjusted to reduce the power of the unsealing energy 112 required to damage the seal, such as by varying a material composition which forms the seal 108.

In one example, the MEMS device 104 is a pressure sensor, the cavity 106 is covered by a membrane, and the seal 108 is formed from a same material as the membrane. The seal 108 can be manufactured on top of the membrane instead of being an integral part of it, using additional lithography mask and processing steps. This gives more design and processing freedom.

In another example embodiment, the MEMS device 104 (e.g. a capacitive CMOS pressure sensor) can include two matched structures, each having a seal. A first structure is used as the actual pressure sensor and a second matched calibration structure is used to determine the cavity pressure of the first structure.

During a calibration procedure a parameter (e.g. an ambient pressure at which the capacitance, resonance frequency, and/or Q factor are equal) of both devices is measured to find any mismatch between the two. Then the seal of one of the two structures is damaged and its parameter is measured again. From the change in the parameter of this second structure, a cavity pressure of the second structure prior to damaging the seal is determined. Since the two structures are identical, the cavity pressure of the first structure (e.g. an actual pressure sensor) is now also known.

For a more accurate determination of the cavity pressure of these matched devices the main membrane of both the sealed device and the open device should have identical properties, except those properties that change with the cavity pressure. In one example, this means that the lateral dimensions, the gap size, the stress of the main membrane, its thickness and composition, and its other mechanical properties should remain unchanged.

A difference in the parameter (e.g. resonance frequency) between the two matched MEMS devices can be monitored on a regular basis to correct for outgassing. If there was any mismatch in the parameter (e.g. resonance frequency, capacitance, etc.) between the two structures prior to damaging the seal (as a result of layer thickness differences, size differences, stress differences) a correction factor is applied.

Note that while in the figures presented and to follow pressure sensors and other elements are shown as either square or rectangular, other shapes (e.g. circular, rounded corners, tapered, etc.) can also be fabricated.

Figure 2:
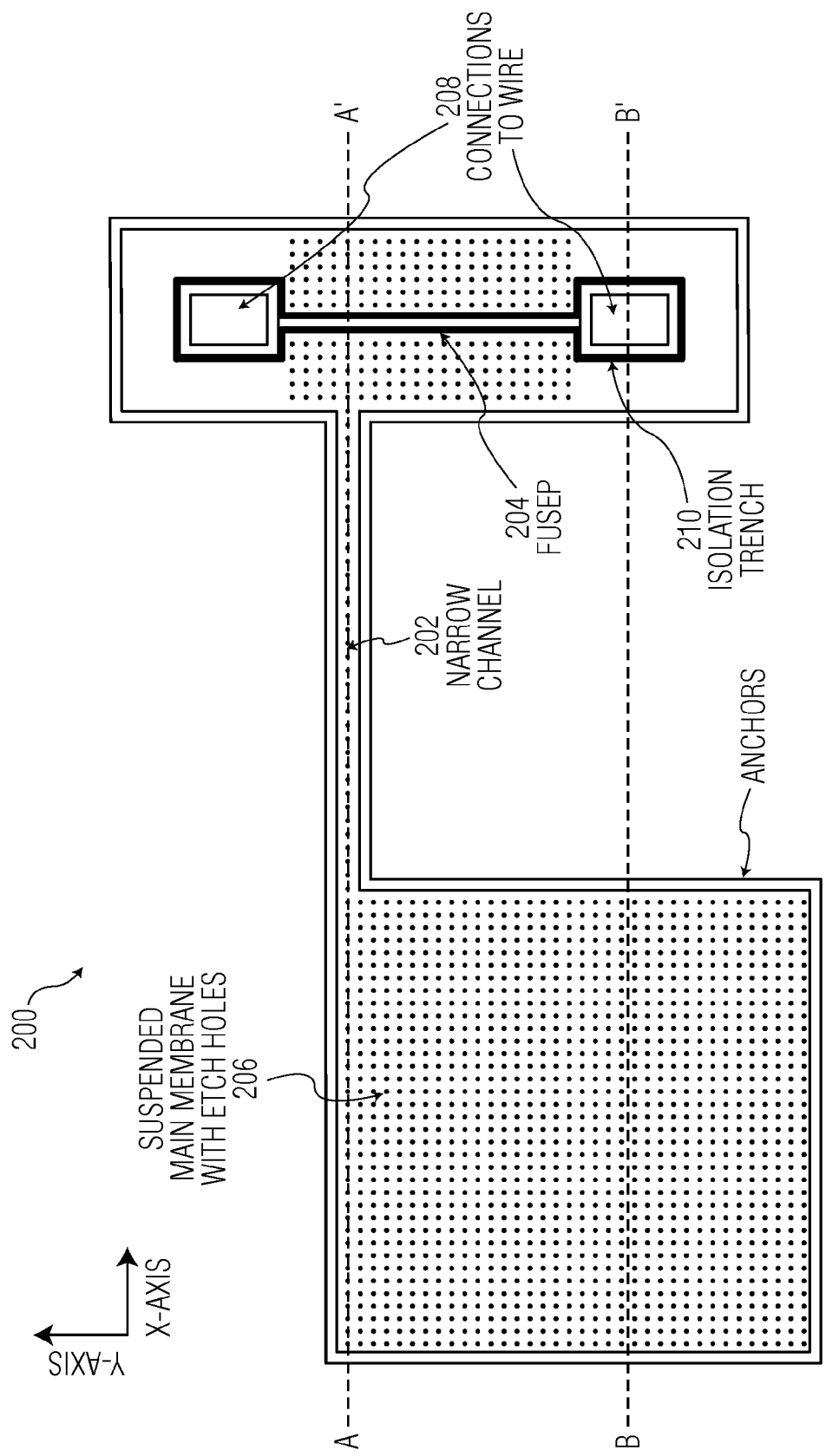
FIG. 2 is a top view of another example of a MEMS device.

FIG. 2 is a top view of another example of a MEMS device 200, and FIGS. 3A and 3B are a cross-sectional views A-A' and B-B' of the FIG. 2 MEMS device 200. In this example the MEMS device 200 is a pressure sensor. FIGS. 2 and 3 are discussed together.

The MEMS device 200 includes a channel 202 coupling a cavity 302 to a first example seal 204 (e.g. a fuse). The channel 202 protrudes laterally from the main suspended membrane of the pressure sensor. The channel 202 is coupled to the cavity 302 at one end and to the seal 204 at the other end.

The width of the narrow channel 202 should be of negligible size compared to the lateral dimensions of the main sensor membrane 206 to prevent changes in the mechanical properties that affect the sensor membrane 206 shape (e.g. so as to not significantly influence the main membrane 206 properties). Thus in one example embodiment, the channel 202 has a width which is at least an order of magnitude less than a width of the cavity 302 so as not to affect pressures sensed by the MEMS device 200 membrane 206. In another example embodiment, the channel 202 is coupled to a corner of the cavity 302 for similar reasons. Etch holes in the membrane 206 are sealed with a silicon oxide and/or a silicon nitride layer 304 after a sacrificial layer etch which created the cavity 302.

In this example, the seal 204 is a wire connected to a set of bond pads 208. The wire and bond pads 208 are surrounded by an electrical and thermal isolation trench 210. An electrical voltage potential is connected to the bond pads 208 causing an electrical current to flow through the wire in the seal 204. The electrical current causes localized heating of the wire. For a single isolated wire with ambient temperature at its ends, the maximum temperature is proportional to the product of voltage, current and wire length. The heat conduction of the heated wire to its environment will mainly be determined by the membrane 206 material. In the example simulation described below the membrane material 206 includes tungsten, titanium, and titanium nitride.

When the thermo-mechanical stress, caused by the heating, exceeds a fracture strength or yield stress of the wire and/or membrane 206 material, cracks will form that will allow gas to escape/enter the previously sealed cavity 302. Thermo-mechanical stresses can also cause delamination of layers that facilitates the opening of the cavity 302. If necessary, the shape of the wire can be optimized so that it is more fragile (e.g. by adding sharp corners and/or increasing thermal isolation of the wire).

In an example simulation with a tungsten membrane material 206 of 100×100 um$^2$ with an in the center a meander of 28 wires of 40 μm long and a cross section of 0.7×0.7 μm$^2$ is now described. The wire is electrically isolated from the surrounding tungsten by SiO2. The total electrical resistance of the meander is 114 Ohms. At a current of 25 mA (and a voltage drop of 2.85 V) a temperature of 1400 K is reached after 30 μsec which caused sufficient damage to the seal 204 to permit gas to flow from outside the MEMS device pressure sensor 200 into the cavity 302. The power consumption is 70 mW. The melting point of SiO2 is 1600° C. and the melting point of tungsten is 3422° C.

For damaging the seal 204 by means of on-chip electronics, the available voltage is dependent upon the chip supply voltage (e.g. 1.8 V). A higher current increases a required chip area because the size of the power transistor needed to switch the current scales with the required maximum current. To dissipate 50 mW at 1V, a current of 50 mA is needed and a resistance of 20 Ohms. If the wire has a cross section of 0.7×0.7 μm$^2$ then the length of the wire should be 196 μm.

Figure 4:
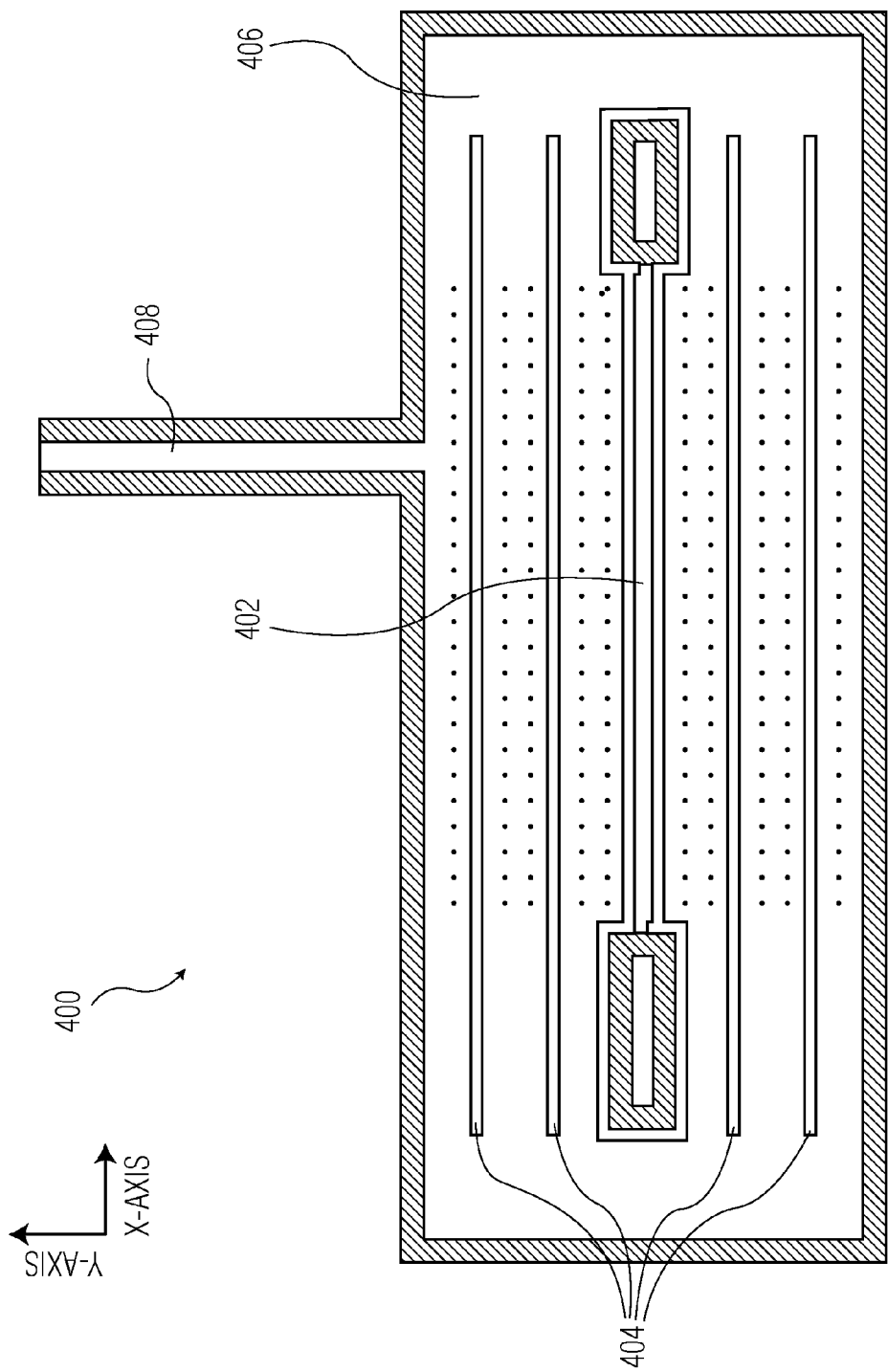
FIG. 4 is a top view of a second example seal in a MEMS device.

FIG. 4 is a top view of a second example seal 402 (e.g. a fuse) in a MEMS device 400. A portion of a channel 408 connecting the seal 402 to the rest of the MEMS device 400 is also shown. The fuse 402 can have thermal isolation trenches 404 next to it for a higher temperature at the center of the fuse 402 at the same power input. For a maximum temperature difference between a membrane substrate 406 and the fuse 402 at a given power input, there are various design parameters and boundary conditions that affect MEMS device 400 design freedom.

One first design parameter is that power dissipation of the fuse 402 per unit area should be as high as possible. This can be achieved by maximizing the electrical resistance per unit area of the fuse 402. This can be achieved by using the narrowest possible width for the fuse 402 and by using as many corners (see later Figures) as possible. Minimizing the electrical resistance of the terminals of the fuse 402 can be achieved by making the terminals as wide as possible.

A second design parameter is that thermal isolation to the substrate 406 should be as high as possible. This can be achieved by maximizing the thermal resistance of the fuse 402 electrodes. This can be achieved by making the fuse 402 terminals as narrow as possible, and adding corners (Note: this design parameter is in tension with the first one above). A long narrow straight line is also an option.

Another way to increase the thermal isolation is by maximizing the thermal resistance between the space surrounding the fuse 402 and any heat sinks (e.g. the membrane substrate 406). This is in particular important for the hottest area of the fuse 402. It can be achieved by adding additional isolation trenches 404 between the fuse 402 and the surrounding membrane.

For a tungsten membrane substrate 406, heat is mainly conducted away through the tungsten and to a much lesser extent through an isolating oxide or nitride. The heat resistance of tungsten is two orders of magnitude lower than of SiO2. Given that the maximum SiO2 width is a small value (0.7 um) (wider gaps cannot be filled without making the layer much thicker), the heat conductance can be tuned by: a shape of the surrounding tungsten; a location where the surrounding tungsten connects to the substrate; and how many isolating trenches are used next to each other.

Figure 5:
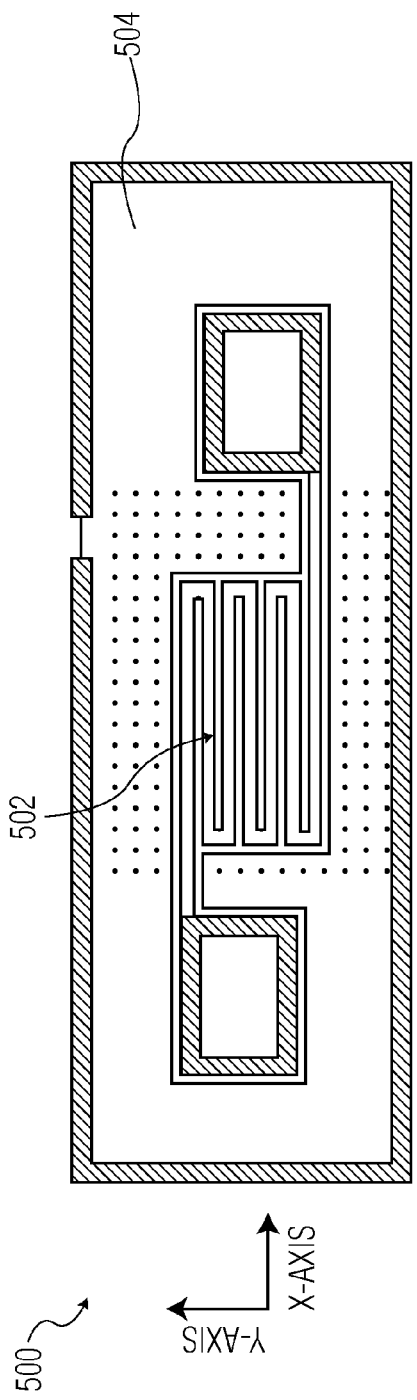
FIG. 5 is a top view of a third example seal in a MEMS device.

FIG. 5 is a top view of a third example seal 502 (e.g. a fuse) in a MEMS device 500. In this example, the seal 502 is a single meandering fuse 502 on a portion of a membrane substrate 504. The meandering fuse 502 shape increases heating efficiency. In the single meander, the power dissipation at the corners is larger than in the straight line portions. A power dissipation per unit area of the simple meander can be increased by adding more corners.

Figure 6:
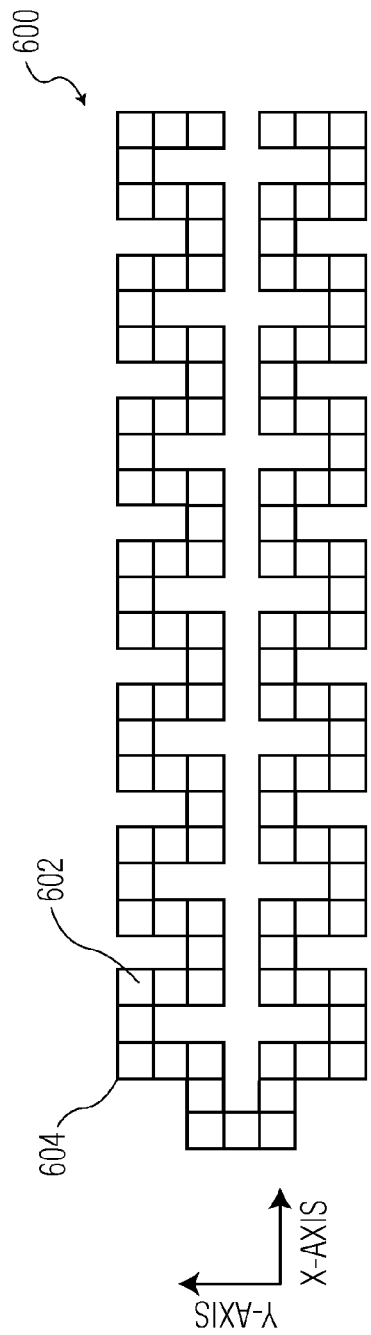
FIG. 6 is a top view of a fourth example seal in a MEMS device.

FIG. 6 is a top view of a fourth example seal 602 (e.g. a fuse) in a MEMS device 600. In this example, the seal 602 is a double meandering fuse 502. A double meander has almost 30% larger resistance per unit area compared to a simple meander since the double meanders have more corners 604. Total resistance of a double meander is larger than that of a single meander for a same membrane substrate area.

Figure 7:
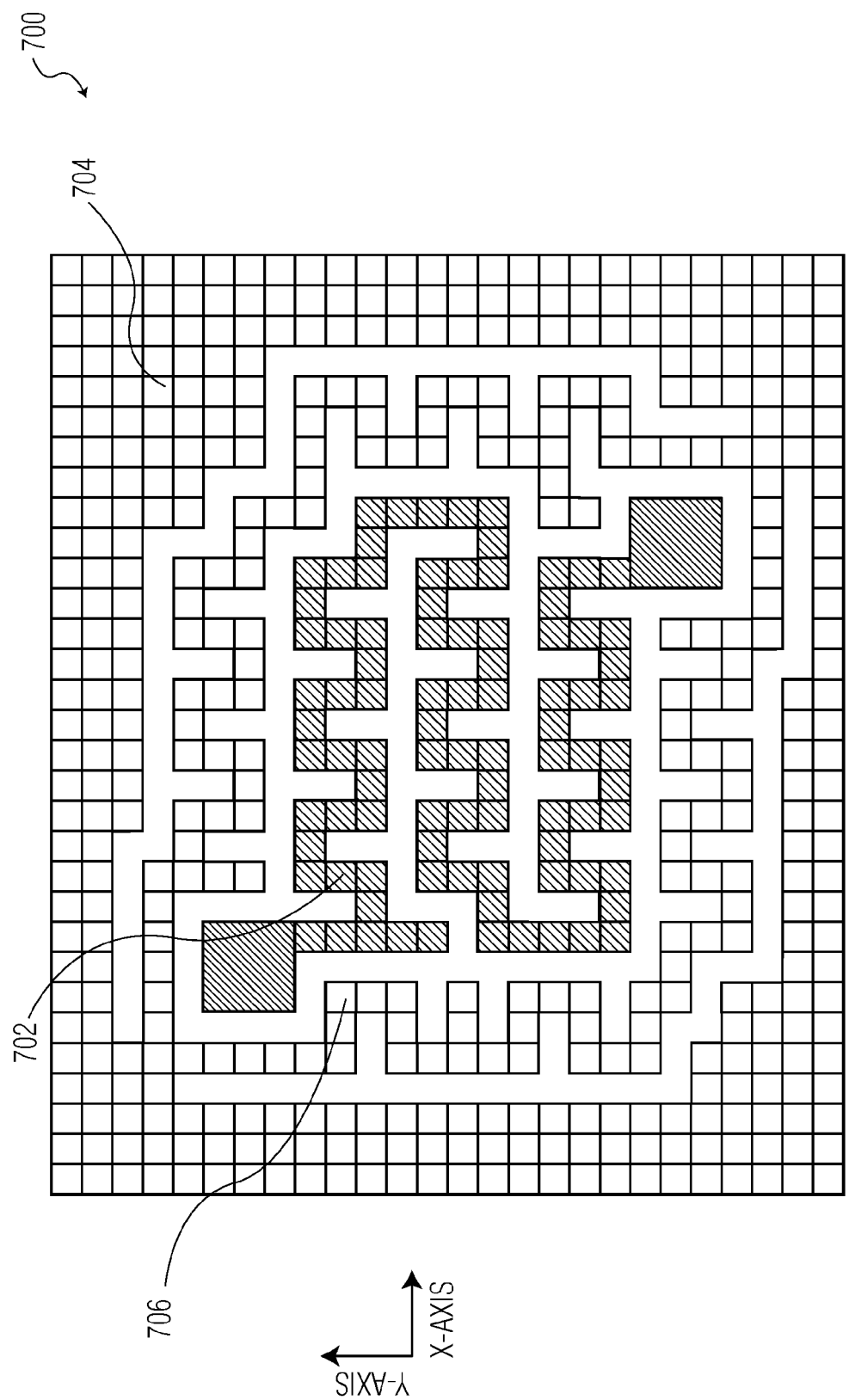
FIG. 7 is a top view of a fifth example seal in a MEMS device.

FIG. 7 is a top view of a fifth example seal 702 in a MEMS device 700 fabricated on a membrane substrate 704. In this example isolating trenches 706 surround the meandering fuse 702 and are designed in the same style, thereby reducing a thermal conductance to the substrate 704 and increasing the thermal isolation from the substrate 704

Figure 8:
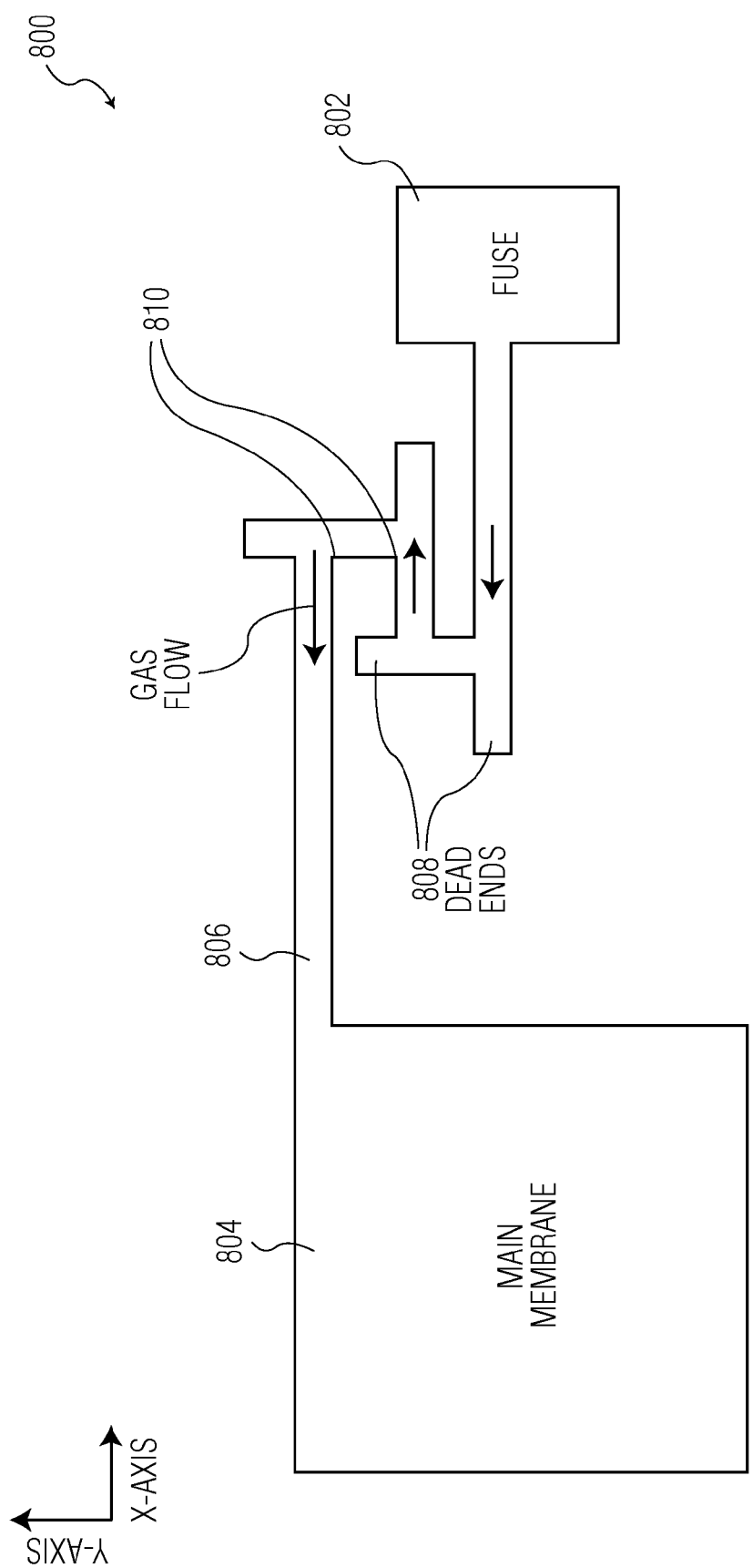
FIG. 8 is a top view of another example of a MEMS device.

FIG. 8 is a top view of another example of a MEMS device 800. The MEMS device 800 includes a sixth example seal 802 (e.g. a fuse such as those described in FIGS. 1-7), a main membrane substrate 804, a main channel 806, and blocked side channel 808 (e.g. dead ends). The blocked side channels 808 (e.g. dead ends) in the channel 806 includes a main channel trap particles. An example direction of gas flow is shown with white arrows. Before the fuse 802 breaks, pressure inside a cavity under the main membrane 804 may be lower than a pressure in an external environment. So when the fuse 802 breaks there will be a gas flow towards the cavity until the pressure is equalized. Debris from the fuse 802 may thus be blown towards the cavity, but preferably should not reach the cavity so as to not affect MEMS device 800 operation. Blocking the particles and debris can be accomplished by narrowing the channel 806, adding sharp corners 810, and/or adding dead ends 808 (i.e. terminated, blocked, etc.). Particles and debris will get trapped in the dead ends 808.

Figure 9:
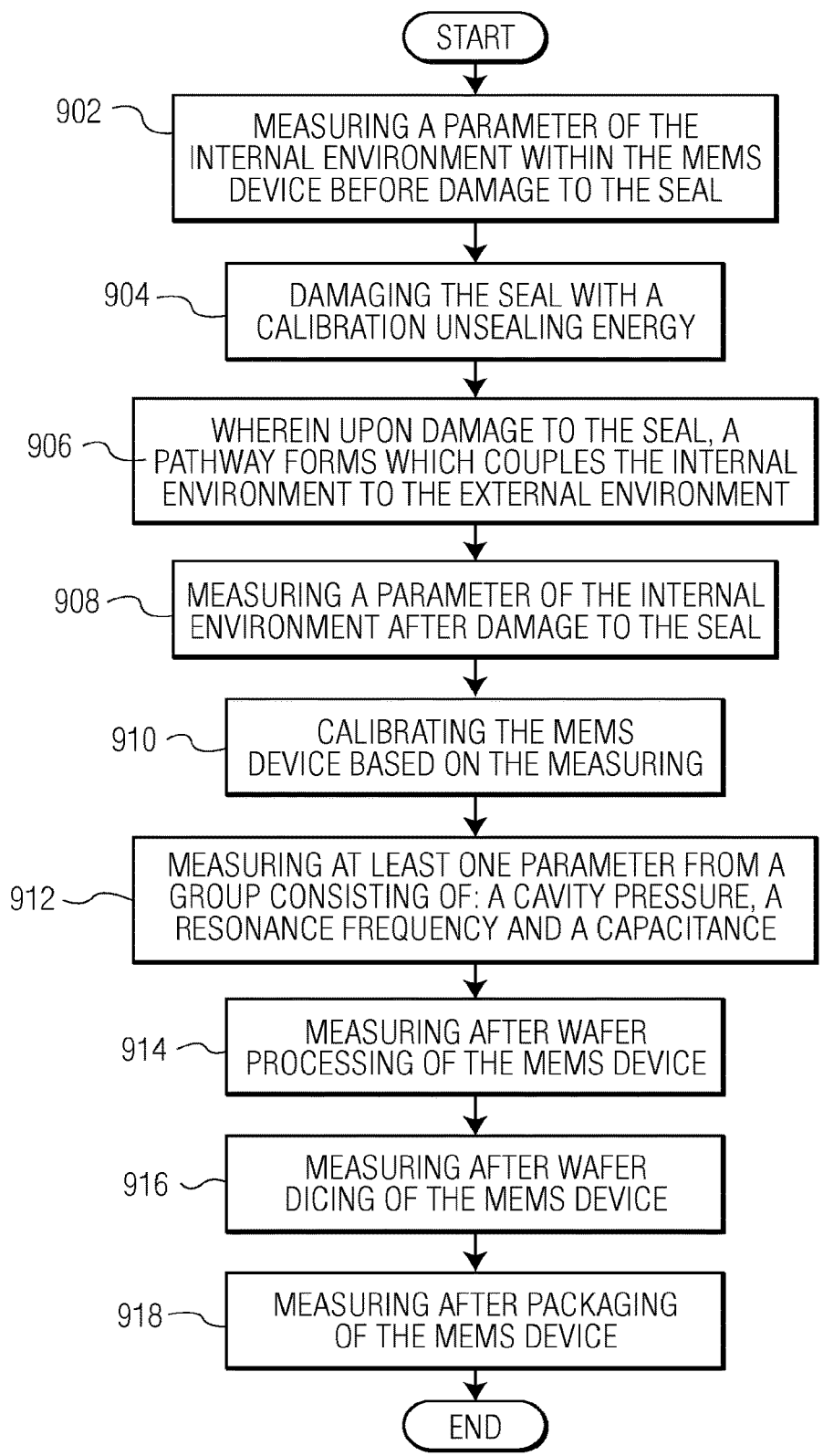
FIG. 9 is one example of a method for calibrating a MEMS device.

FIG. 9 is one example of a method for calibrating a MEMS device having a seal isolating an internal environment within the MEMS device from an external environment outside the MEMS device. The method is now discussed as a set of blocks which are presented in one example order of execution. In one example, this method can be interpreted according to the embodiments presented and discussed in FIGS. 1-8. In alternate example embodiments, these blocks can be executed in various other orders. The method begins in block 902, by measuring a parameter of the internal environment within the MEMS device before damage to the seal. Next, in block 904, damaging the seal with a calibration unsealing energy. Then in block 906, wherein upon damage to the seal, a pathway forms which couples the internal environment to the external environment. In block 908, measuring a parameter of the internal environment after damage to the seal. And then in block 910, calibrating the MEMS device based on the measuring.

The method can be augmented with one or more of the following blocks, presented in no particular order. In block 912, measuring at least one parameter from a group consisting of: a cavity pressure, a resonance frequency and a capacitance. In block 914, measuring after wafer processing of the MEMS device. In block 916, measuring after wafer dicing of the MEMS device. In block 918, measuring after packaging of the MEMS device.

The blocks comprising the flowcharts in the above Figures can be executed in any order, unless a specific order is explicitly stated. Also, those skilled in the art will recognize that while one example method embodiment is now discussed, the material in this specification can be combined in a variety of ways to yield other examples as well. The method next discussed is to be understood within a context provided by this and other portions of this detailed description.

In some example embodiments the method steps described above are implemented as functional and software instructions embodied as a set of executable instructions which are effected on a computer or machine which is programmed with and controlled by said executable instructions. Such instructions are loaded for execution on a processor (such as one or more CPUs). The processor includes microprocessors, microcontrollers, processor modules or subsystems (including one or more microprocessors or microcontrollers), or other control or computing devices. A processor can refer to a single component or to plural components.

In other examples, the methods illustrated herein and data and instructions associated therewith are stored in respective storage devices, which are implemented as one or more non-transient machine or computer-readable or computer-usable storage media or mediums. Such computer-readable or computer-usable storage medium or media is (are) considered to be part of an article (or article of manufacture). An article or article of manufacture can refer to any manufactured single component or multiple components. The non-transient machine or computer-usable media or mediums as defined herein excludes signals, but such media or mediums may be capable of receiving and processing information from signals and/or other transient mediums. The storage media include different forms of memory including semiconductor memory devices such as DRAM, or SRAM, Erasable and Programmable Read-Only Memories (EPROMs), Electrically Erasable and Programmable Read-Only Memories (EEPROMs) and flash memories; magnetic disks such as fixed, floppy and removable disks; other magnetic media including tape; and optical media such as Compact Disks (CDs) or Digital Versatile Disks (DVDs).

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A MEMS device, comprising:
   a cavity having an internal environment;
   a seal isolating the internal environment from an external environment outside the MEMS device, wherein the seal is susceptible to damage in response to a calibration unsealing energy, wherein upon damage to the seal, a pathway forms which couples the internal environment to the external environment, wherein the seal is a fusible link, and wherein the fusible link can damage the seal in response to an electrical current;
   a calibration circuit capable of measuring a parameter of the internal environment before and after damage to the seal; and
   a channel coupling a corner of the cavity to the seal.

2. The device of claim 1, further comprising:
   a hermetically sealed second device, wherein the calibration circuit is capable of generating a calibration value for the second device in response to measuring the parameter of the internal environment before and after damage to the seal.

3. The device of claim 2, wherein the second device is a pressure sensor.

4. The device of claim 1, wherein the MEMS device is embedded in a package, and wherein the seal is susceptible to damage in response to the calibration unsealing energy while within the package.

5. The device of claim 1, wherein the unsealing energy includes a heat source that is the electrical current.

6. The device of claim 1, wherein the damage the seal is susceptible to includes at least one from a group consisting of: rupturing, breaching, breaking, fracturing, cracking, delamination, indentation, puncturing, drilling, evaporation, ablation and melting.

7. The device of claim 1, wherein the seal includes a thermal isolation region which reduces a power of the unsealing energy required to damage the seal.

8. The device of claim 1, wherein the seal includes a region with a power dissipation per unit area which reduces a power of the unsealing energy required to damage the seal.

9. The device of claim 1, wherein the seal includes a wire and an isolation trench.

10. The device of claim 1, wherein the seal includes a wire having a meandering shape.

11. The device of claim 1, further comprising:
    a channel coupling the cavity to the seal, wherein the channel includes a width an order of magnitude less than a width of the cavity.

12. The device of claim 1 further comprising:
    a channel coupling the cavity to the seal, wherein the channel includes a main channel and at least one from a group consisting of: a blocked side channel and a sharp corner.

13. The device of claim 1, wherein, the MEMS device is a pressure sensor, the cavity is covered by a membrane, and the seal is formed from a same material as the membrane.

14. A method calibrating a MEMS device having a seal isolating an internal environment within the MEMS device from an external environment outside the MEMS device, comprising:
    measuring a parameter of the internal environment within the MEMS device before damage to the seal;
    damaging the seal with a calibration unsealing energy, wherein upon damage to the seal, a pathway forms which couples the internal environment to the external environment, wherein the seal is a fusible link, and wherein the fusible link can damage the seal in response to an electrical current;
    measuring a parameter of the internal environment after damage to the seal; and
    calibrating the MEMS device based on the measuring, wherein the seal includes a thermal isolation region which reduces a power of the unsealing energy required to damage the seal.

15. The device of claim 14, wherein the MEMS device includes a hermetically sealed first device and a calibration device, further comprising:
  calibrating the first device in response to measuring the parameter of the internal environment of the second device before and after damage to the seal on the second device.
16. The method of claim 14, wherein measuring includes:
  measuring at least one parameter from a group consisting of: a cavity pressure, a resonance frequency, a quality factor, a capacitance, a capacitance-voltage response, a capacitance pressure response and a capacitance temperature response.
17. The method of claim 14, wherein measuring includes:
  measuring after wafer processing of the MEMS device.
18. The method of claim 14, wherein measuring includes:
  measuring after wafer dicing of the MEMS device.
19. The method of claim 14, wherein measuring includes:
  measuring after packaging of the MEMS device.
20. The method of claim 14, wherein measuring includes:
  measuring after a final assembly of the MEMS device on a printed circuit board in a final application.
21. A MEMS device, comprising:
  a cavity having an internal environment;
  a seal isolating the internal environment from an external environment outside the MEMS device,
  wherein the seal is susceptible to damage in response to a calibration unsealing energy, wherein upon damage to the seal, a pathway forms which couples the internal environment to the external environment, wherein the seal is a fusible link, and wherein the fusible link can damage the seal in response to an electrical current; and
  a calibration circuit capable of measuring a parameter of the internal environment before and after damage to the seal,
  wherein the seal includes a thermal isolation region which reduces a power of the unsealing energy required to damage the seal.
22. A MEMS device, comprising:
  a cavity having an internal environment;
  a seal isolating the internal environment from an external environment outside the MEMS device,
  wherein the seal is susceptible to damage in response to a calibration unsealing energy, wherein upon damage to the seal, a pathway forms which couples the internal environment to the external environment, wherein the seal is a fusible link, and wherein the fusible link can damage the seal in response to an electrical current; and
  a calibration circuit capable of measuring a parameter of the internal environment before and after damage to the seal,
  wherein the seal includes a wire and an isolation trench.
23. A MEMS device, comprising:
  a cavity having an internal environment;
  a seal isolating the internal environment from an external environment outside the MEMS device,
  wherein the seal is susceptible to damage in response to a calibration unsealing energy, wherein upon damage to the seal, a pathway forms which couples the internal environment to the external environment, wherein the seal is a fusible link, and wherein the fusible link can damage the seal in response to an electrical current;
  a calibration circuit capable of measuring a parameter of the internal environment before and after damage to the seal; and
  a channel coupling the cavity to the seal, wherein the channel includes a main channel and at least one from a group consisting of: a blocked side channel and a sharp corner.

* * * * *